(12) United States Patent
Samarao et al.

(10) Patent No.: US 9,945,727 B2
(45) Date of Patent: Apr. 17, 2018

(54) RESISTIVE SWITCHING FOR MEMS DEVICES

(71) Applicant: Robert Bosch GmbH, Stuttgart (DE)

(72) Inventors: Ashwin K. Samarao, Sunnyvale, CA (US); Gary O'Brien, Palo Alto, CA (US); Ando Feyh, Reutlingen (DE); Fabian Purkl, Gerlingen (DE); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/534,110

(22) PCT Filed: Dec. 10, 2015

(86) PCT No.: PCT/US2015/065050
§ 371 (c)(1),
(2) Date: Jun. 8, 2017

(87) PCT Pub. No.: WO2016/094693
PCT Pub. Date: Jun. 16, 2016

(65) Prior Publication Data
US 2017/0363478 A1 Dec. 21, 2017

Related U.S. Application Data

(60) Provisional application No. 62/089,904, filed on Dec. 10, 2014.

(51) Int. Cl.
*G01J 5/20* (2006.01)
*G01J 5/02* (2006.01)
(Continued)

(52) U.S. Cl.
CPC ............... *G01J 5/20* (2013.01); *G01J 5/024* (2013.01); *G01J 5/0853* (2013.01);
(Continued)

(58) Field of Classification Search
CPC .. H01L 27/2472; H01L 27/14669; G01J 5/20; G01J 5/024; G01J 5/0853
See application file for complete search history.

(56) References Cited

U.S. PATENT DOCUMENTS 9,199,838 B2 * 12/2015 O'Brien ............... B81B 7/0019
2011/0027941 A1  2/2011 Kumar et al.
(Continued)

OTHER PUBLICATIONS

International Search Report corresponding to PCT Application No. PCT/US2015/065050, dated Apr. 22, 2016 (3 pages).

*Primary Examiner* — Marcus Taningco
(74) *Attorney, Agent, or Firm* — Maginot Moore & Beck LLP

(57) ABSTRACT

A MEMS device includes a bolometer attached to a silicon wafer by a base portion of at least one anchor structure. The base portion comprises a layer stack having a metal-insulator-metal (MIM) configuration such that the base portion acts as a resistive switch such that, when the first DC voltage is applied to the patterned conductive layer, the base portion transitions from a high resistive state to a low resistive state, and, when the second DC voltage is applied to the patterned conductive layer, the base portion transitions from a high resistive state to a low resistive state.

14 Claims, 8 Drawing Sheets

(51) Int. Cl.
  *G01J 5/08* (2006.01)
  *H01L 27/24* (2006.01)
  *H01L 27/146* (2006.01)
  *H01L 45/00* (2006.01)

(52) U.S. Cl.
  CPC .... *H01L 27/14669* (2013.01); *H01L 27/2472* (2013.01); *H01L 45/1616* (2013.01); *G01J 2005/202* (2013.01)

(56) References Cited

U.S. PATENT DOCUMENTS

| | | | |
|---|---|---|---|
| 2013/0146773 A1* | 6/2013 | Ouvrier-Buffet | G01J 5/20 250/349 |
| 2013/0156993 A1 | 6/2013 | Czabaj et al. | |
| 2014/0054462 A1 | 2/2014 | Samarao et al. | |
| 2014/0175284 A1* | 6/2014 | Roh | G01J 5/0853 250/338.4 |
| 2014/0175285 A1* | 6/2014 | Yama | G01J 5/0245 250/338.4 |
| 2014/0175588 A1* | 6/2014 | Purkl | G01J 5/20 257/432 |
| 2014/0226021 A1 | 8/2014 | Koechlin et al. | |
| 2014/0294043 A1 | 10/2014 | Samarao et al. | |
| 2015/0039271 A1* | 2/2015 | Durand | G01J 5/22 702/183 |

\* cited by examiner

RESISTIVE SWITCHING FOR MEMS DEVICES

CROSS-REFERENCE TO RELATED APPLICATIONS

This application is a 35 U.S.C. § 371 National Stage Application of PCT/US2015/065050, filed on Dec. 10, 2015, which claims priority to U.S. Provisional Patent Application No. 62/089,904, which is entitled "RESISTIVE SWITCHING FOR MEMS DEVICES," and was filed on Dec. 10, 2014. The disclosures of the above-identified patent applications are both incorporated by reference herein in their entirety.

TECHNICAL FIELD

This disclosure relates generally to microelectromechanical system (MEMS) devices and in particular to methods of manufacturing MEMS devices.

BACKGROUND

In general, bolometers implemented using MEMS technology are typically provided with a very thin layer or film which serves as an absorber for the bolometer. The absorber is formed of a material which is capable of absorbing energy from incident infrared radiation and is provided in a substrate in a manner that maximizes exposure to infrared radiation while minimizing thermal loss to the substrate.

A transducer having an electrical resistance that varies with temperature is provided in thermal contact with absorber. Infrared radiation incident upon the bolometer will be absorbed by the absorber element of the bolometer and the heat generated by the absorbed radiation will be transferred to the transducer element. As the transducer element heats in response to the absorbed radiation, the electrical resistance of the transducer element will change in a predetermined manner. By detecting changes in the electrical resistance, a measure of the incident infrared radiation can be obtained.

A current must flow through the transducer element of the bolometer in order for the transducer element to function as a resistor and exhibit temperature dependent resistance changes. The requirements imposed by MEMS technology on the fabrication process have limited the ability to incorporate switching mechanisms into bolometer devices for controlling the flow of current to the bolometer. As a result, current may flow through the transducer element continuously when the device is powered so that power is consumed at all times, even in a standby mode when the device is powered on but not being used to detect temperature.

Furthermore, not being able to effectively switch individual MEMS bolometers ON/OFF can limit the functionality of certain devices, such as infrared cameras and thermal imaging sensors, where multiple bolometers are provided in arrays to serve as pixels of an image sensor. The selective reading out of the temperature values indicated by the bolometer pixels is performed by evaluation circuitry which is typically implemented separately using CMOS technology on a semiconductor chip.

SUMMARY

According to one embodiment, a microelectromechanical systems (MEMS) device, comprises a silicon wafer having an upper surface defining a sensing region, a patterned conductive layer on the upper surface, and a bolometer including a suspension portion that extends over the sensing region. The suspension portion is suspended above the sensing region by at least one anchor structure which extends upwardly from the patterned conductive layer to space the suspension portion a predetermined distance apart from the upper surface of the silicon wafer. The suspension portion and the at least one anchor structure are formed by a layer stack comprising a bottom insulator layer and a top conductive layer. A control circuit is electrically connected to the patterned conductive layer and is configured to selectively apply a first DC voltage and a second DC voltage to the patterned conductive layer. The at least one anchor structure includes a base portion that is attached to the patterned conductive layer. In the base portion of the at least one anchor structure, the bottom insulator layer is arranged adjacent the patterned conductive layer and is interposed between the top conductive layer and the patterned conductive layer such that there is no direct contact between the top conductive layer and the patterned conductive layer. The base portion of the at least one anchor structure is configured as a resistive switch such that, when the first DC voltage is applied to the patterned conductive layer, the base portion transitions from a high resistive state to a low resistive state, and, when the second DC voltage is applied to the patterned conductive layer, the base portion transitions from a high resistive state to a low resistive state. When in the high resistive state, the base portion has a resistance that substantially prevents current flow between the top conductive layer and the patterned conductive layer, and, when in the low resistive state, the base portion of the at least one anchor structure forms an ohmic contact between the top conductive layer and the patterned conductive layer such that enables current to flow between the top conductive layer and the patterned conductive layer.

In another embodiment, a method of operating a MEMS device comprises applying a first DC voltage to a base portion of at least one anchor structure of a bolometer. The bolometer includes a suspension portion that extends over a sensing region on a silicon wafer. The at least one anchor structure extends upwardly from a patterned conductive layer on the silicon wafer to space the suspension portion a predetermined distance apart from an upper surface of the silicon wafer. At least the base portion of the at least one anchor structure is formed by a layer stack comprising a bottom insulator layer and a top conductive layer. The bottom insulator layer is arranged adjacent the patterned conductive layer and is interposed between the top conductive layer and the patterned conductive layer such that there is no direct contact between the top conductive layer and the patterned conductive layer. The base portion of the at least one anchor structure is configured as a resistive switch such that, when the first DC voltage is applied, the base portion transitions from a high resistive state to a low resistive state. When in the high resistive state, the base portion has a resistance that substantially prevents current flow between the top conductive layer and the patterned conductive layer, and, when in the low resistive state, the base portion of the at least one anchor structure forms an ohmic contact between the top conductive layer and the patterned conductive layer such that enables current to flow between the top conductive layer and the patterned conductive layer.

According to yet another embodiment, a focal-plane-array of bolometers comprises an array of bolometers having a predetermined number of rows and a predetermined number of columns. Each of the bolometers includes a suspension portion that extends over a sensing region on a silicon wafer, and at least one anchor structure extending upwardly from a patterned conductive layer on the silicon wafer to space the suspension portion a predetermined distance apart from an upper surface of the silicon wafer. The at least one anchor structure includes a base portion formed by a layer stack comprising a bottom insulator layer and a top conductive layer. The bottom insulator layer is arranged adjacent the patterned conductive layer and is interposed between the top conductive layer and the patterned conductive layer such that there is no direct contact between the top conductive layer and the patterned conductive layer. The base portion of the at least one anchor structure is configured as a resistive switch such that, when a SET voltage is applied, the base portion transitions from a high resistive state to a low resistive state, and when a RESET voltage is applied, the base portion transitions from the low resistive state to a high resistive state. A control circuit electrically is connected to array of bolometers by a plurality of word lines and a plurality of bit lines, each of the rows of bolometers being electrically interconnected to each other and to the control circuit by one of the word lines and each of the columns of bolometers being electrically interconnected by one of the bit lines. The control circuit is configured to selectively apply the SET voltage and the RESET voltage to the plurality of word lines and the plurality of bit lines to switch the bolometers in the array on and off in desired patterns.

DRAWINGS

DETAILED DESCRIPTION

Figure 1A:
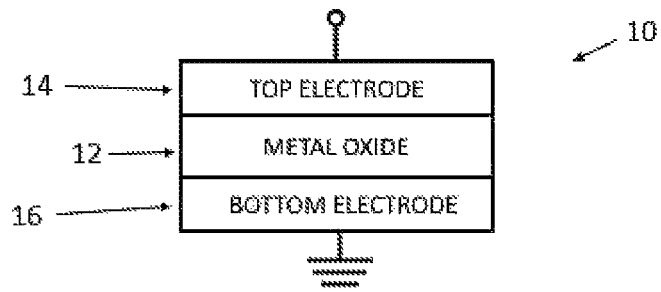
FIG. 1a depicts a device with a metal/metal oxide/metal sequence forming a MIM stack.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The disclosure is directed to MEMS devices methods of fabricating MEMS devices, and in particular MEMS bolometer devices, that integrates a switching mechanism into the MEMS device. As a result, a MEMS bolometer can be turned OFF when not being used so that zero stand-by power can be achieved. Such functionality is very useful while implementing the technology for power-limited applications like handhelds and tablets. Furthermore, the ability to selectively switch individual bolometers enables each bolometer in a bolometer array to be selectively addressed which enables improvements in thermal imaging where bolometer arrays are used as image sensors. For example, the bolometers can be switched ON/OFF in various patterns and groups to optimize the detection of the incoming infrared radiation for various reasons, such as to improve the averaging of the temperature data over the scanned area. The use of switching mechanisms built into the MEMS device also obviates the need for a separate circuit component for addressing and reading out the pixels of the array.

As depicted in FIG. 1a, the resistive switching mechanism 10 is implemented using a metal oxide 12, such as alumina (i.e., aluminum oxide). The metal oxide 12 is used to form a resistive switching element by interposing the metal oxide 12 between the transducer 14 of the bolometer and a conductive layer 16 on the substrate which underlies the transducer and forms the conductive pathways for the readout circuitry. The transducer 14 and the conductive layer 16 are connected to each other only through the metal oxide 12. The transducer 14 as well as the conductive layer 16 may be formed by conductive metal materials, such as platinum, and may be deposited using an atomic layer deposition (ALD) process so that the transducer and the conductive layer are each very thin, e.g, approximately 50 nm.

The metal oxide 12 is deposited to form a thin layer between the transducer 14 and the conductive layer 16 as depicted in FIG. 1a. The metal oxide 12 is deposited using an ALD process to a thickness of approximately 10 nm although thicker and thinner oxide films may be used. In one embodiment, the metal oxide is formed from alumina (See, e.g., FIG. 3) although other types of metal oxides may also be used, such as hafnia, titanium oxide, and tantalum oxide. Each of these materials is compatible with and has been used extensively in MEMS technology. These materials are also each capable of being deposited using ALD.

Figure 1B:
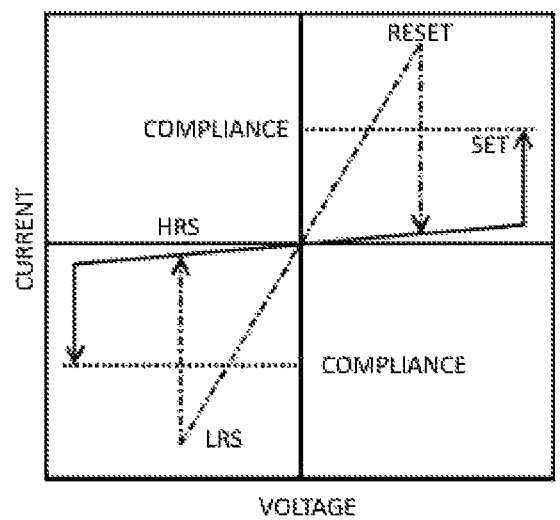
FIG. 1b depicts a graph of an IV curve for the device of FIG. 1a in a unipolar mode of operation.
Figure 1C:
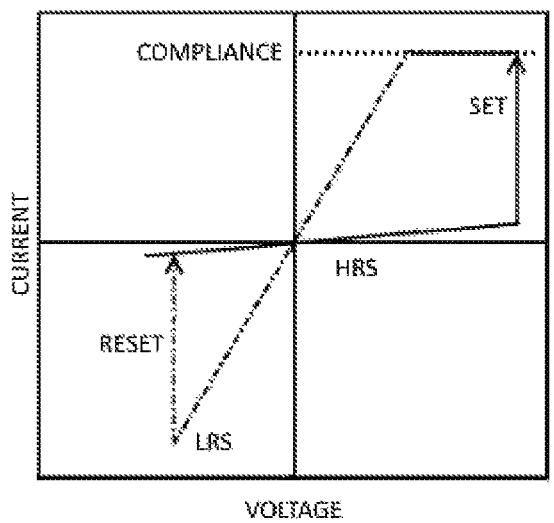
FIG. 1c depicts a graph of an IV curve for the device of FIG. 1a in a bipolar mode of operation.

As depicted in FIG. 1a, the transducer 14, metal oxide 12, and conductive layer 16 form a Metal/Metal Oxide (i.e., Insulator)/Metal layer stack. This type of layer sequence is also referred to as a MIM structure. The metal oxide 12 layer provides electrical resistance between the metal layers 14, 16 that can vary depending on the characteristics of the potential voltage between the metal layers. In particular, the metal oxide layer 12 transitions between a high resistive state (HRS) to a low resistive state (LRS) depending on the characteristics of the voltage between the metal layers (See, e.g., FIGS. 1b, 1c).

Figure 2:
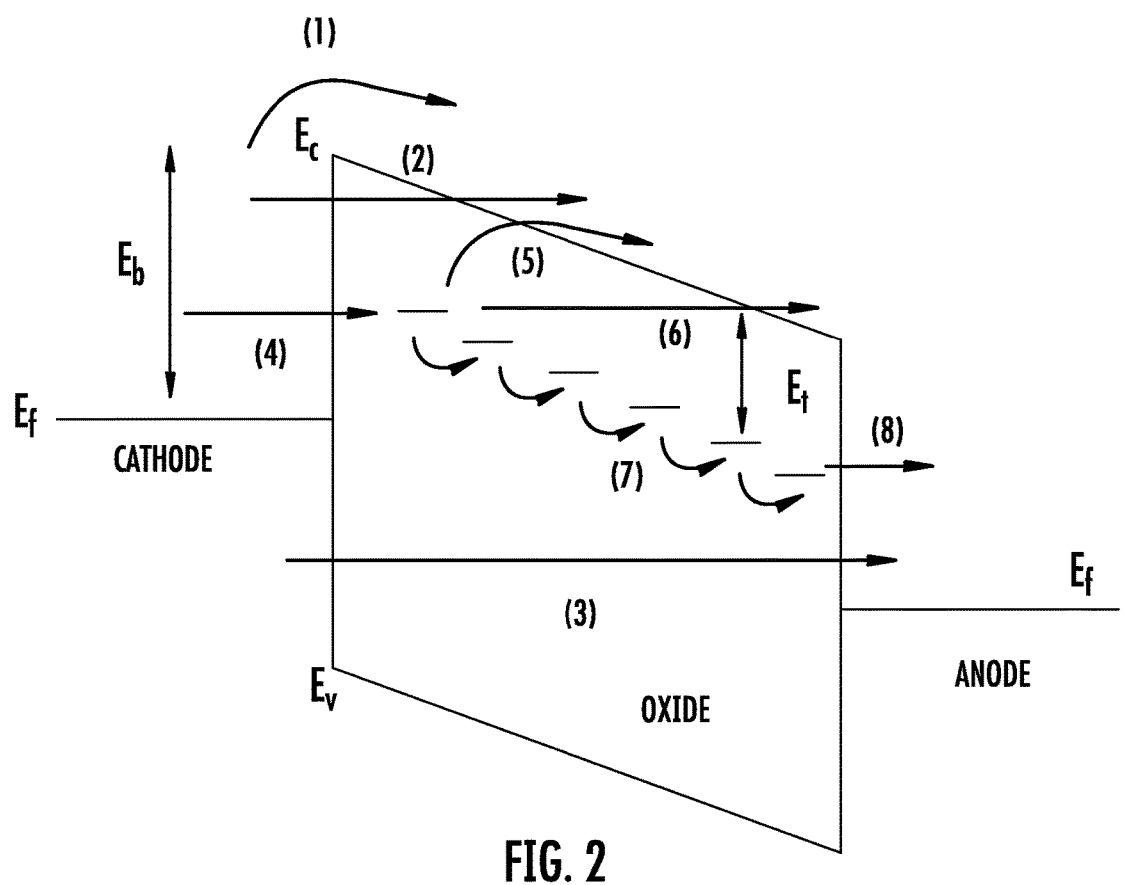
FIG. 2 is a schematic drawings showing possible electron conduction paths for resistive switching in metal oxides.

FIG. 2 depicts the possible mechanisms that can enable resistive switching in metal oxides in a MIM stack. As depicted in FIG. 2, electron conduction paths (labeled (1)-(8)) may be formed between the cathode and anode that pass around or through the oxide barrier. The path labeled (1) is formed by Schottky emission in which thermally activated electrons injected over the barrier into the conduction band. The path labeled (2) is formed by Fowler-Nordhenn (F-N) tunneling in which electrons tunnel from the cathode into the conduction band, e.g., usually at high field. The path labeled (3) is formed by direct tunneling in which electrons tunnel from cathode to anode directly which can occur if the oxide is thin enough. If the oxide has a substantial number of traps (e.g., oxygen vacancies), trap-assisted tunneling may contribute to additional conduction, such as at (4) where tunneling occurs from cathode to traps; at (5) where tunneling occurs from trap to conduction band, e.g, (Poole-Frenkel emission); at (6) where F-N-like tunneling occurs from trap to conduction band; at (7) where trap to trap hopping or tunneling occurs, such as Mott hopping when the electrons are in the localized states or maybe in the form of metallic conduction when the electrons are in the extended states depending on the overlap of the electron wave function; and at (8) where tunneling occurs from traps to anode. Resistive switching may also be based on mobility of oxygen ions (not depicted).

In the present disclosure, transitioning from a high resistive state to a low resistive state is also referred to as SET, and transitioning from a low resistive state to a high resistive state is referred to RESET. The resistive switching can be characterized as bipolar or unipolar. In bipolar resistive switching, voltage of a first polarity, e.g., positive, is used to transition the metal oxide from the high resistive state to the low resistive state, i.e., SET, and a voltage of a second polarity, e.g., negative, is used to transition the metal oxide from the low resistive state to the high resistive state, i.e., RESET.

Figure 3:
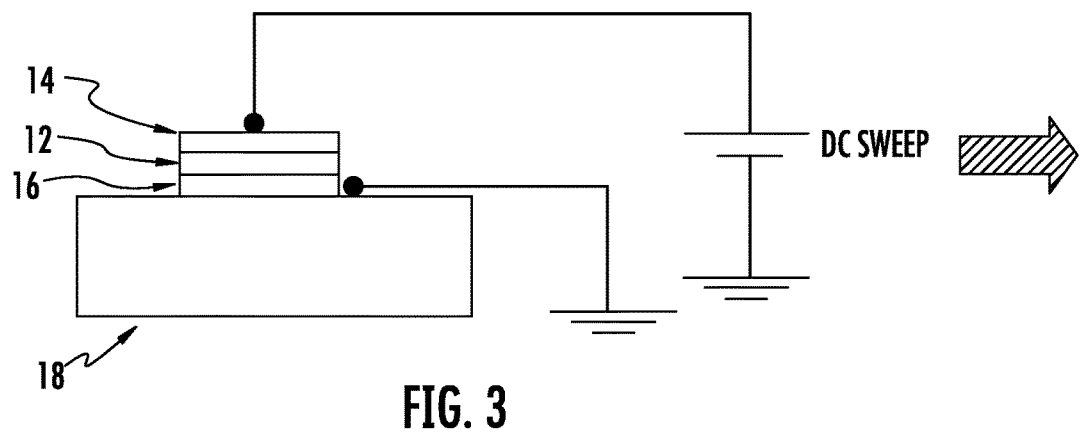
FIG. 3 depicts a MIM stack in which the metal oxide layer is formed by alumina.
Figure 4:
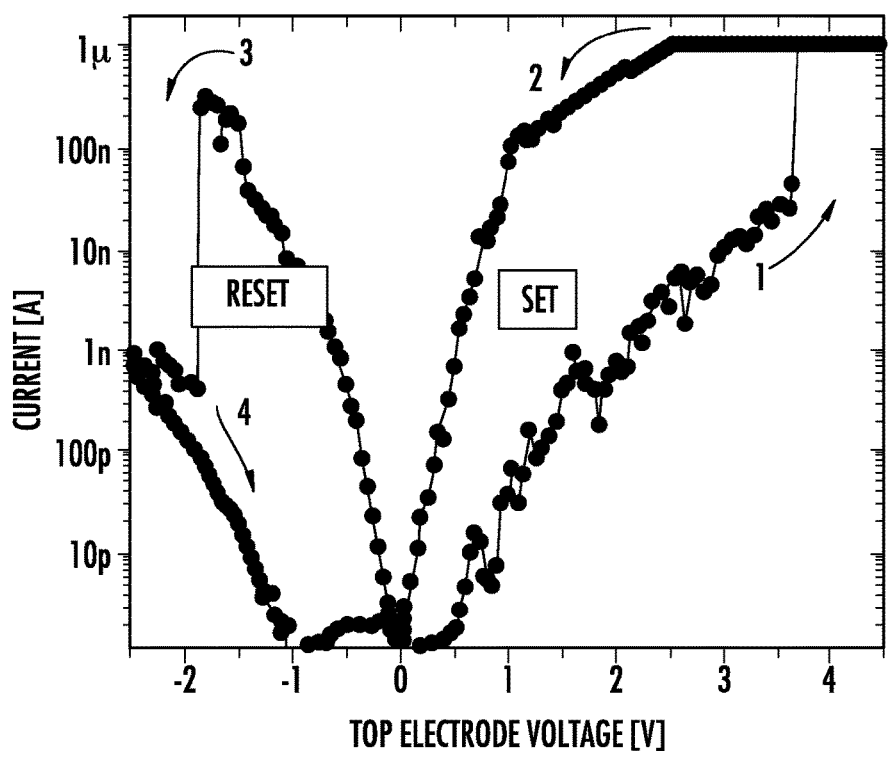
FIG. 4 is a graph of the IV curves for the device of FIG. 3.

In the embodiment of FIG. 3, when the DC voltage applied to the aluminum and platinum layers is swept from 0V to ≈4V, a soft breakdown of the metal oxide (e.g., alumina) layer 12 occurs leading to a transition from the high resistive state to the low resistive state. FIG. 4 is a graph depicting the IV curve (i.e., current versus voltage) for the device of FIG. 3. In FIG. 4, the plot labeled 1 shows the IV curve as the device is being SET. Once SET, the IV curve follows a different plot for all positive voltages (denoted by the plot labeled 2 in FIG. 3) and all negative voltages (denoted by the plot labeled 3 in FIG. 4). While the device is SET, if the DC voltage is swept from 0 to ≈−2 V, a reversal of the soft breakdown of the alumina occurs leading to a transition from LRS to HRS, i.e., RESET. Once RESET, the IV curve follows a different plot for all positive voltages (denoted by the plot labeled 1 in FIG. 4) and all negative voltages (denoted by the plot labeled 4 in FIG. 4).

Figure 5:
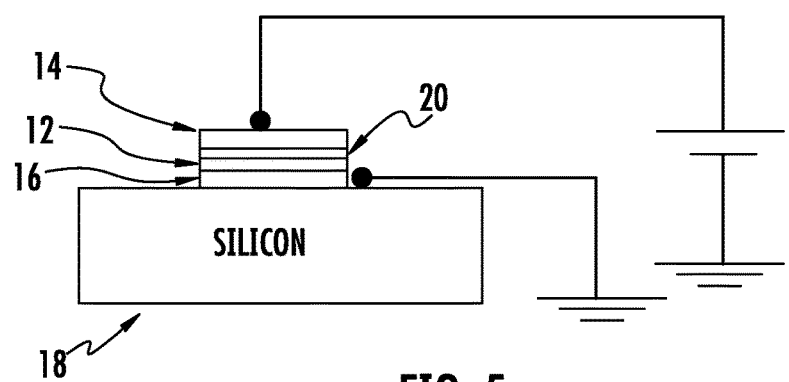
FIG. 5 depicts the device of FIG. 3 further including a metal capping layer for implementing unipolar resistive switching.
Figure 6:
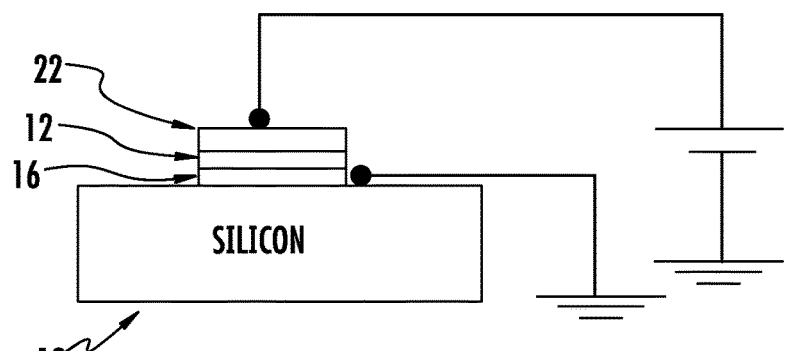
FIG. 6 depicts the device of FIG. 3 in which the upper electrode is formed of a noble metal for implementing unipolar resistive switching.

Unipolar resistive switching may be implemented by either inserting a metal-capping layer 20 between the metal oxide (e.g., alumina) layer 12 and the top metal layer 14 as depicted in FIG. 5, or by replacing the top metal (e.g., aluminum) with a Noble metal 22, such as platinum or ruthenium as depicted in FIG. 6. Unlike bipolar resistive switching, unipolar resistive switching requires one polarity of voltages (e.g, positive) to transition the metal oxide layer between the high resistive state and the low resistive state for SET and RESET.

Figure 7:
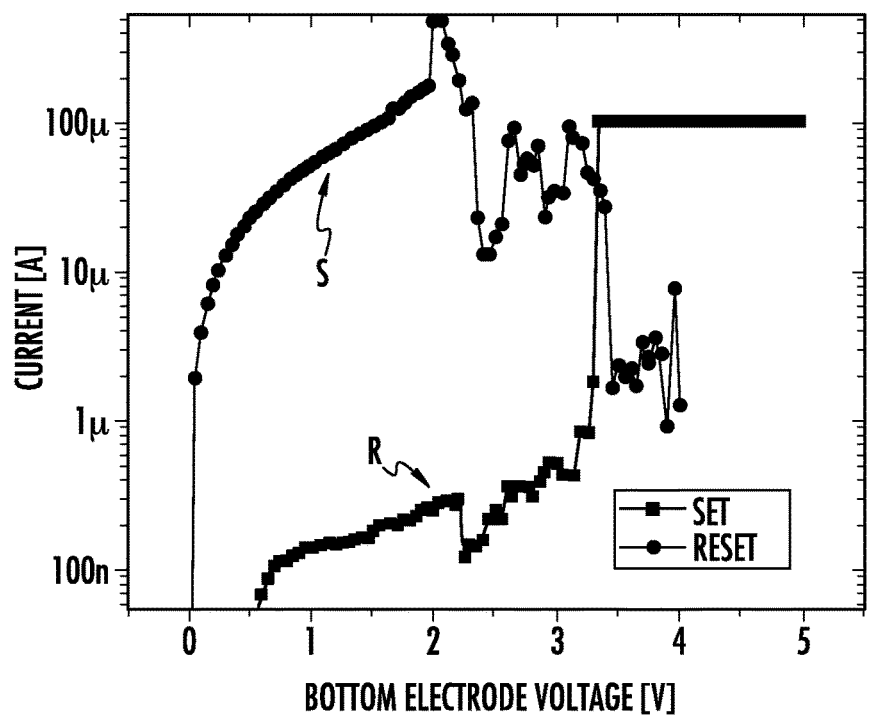
FIG. 7 is a graph of the IV curves for a unipolar device, such as depicted in FIGS. 5 and 6.

FIG. 7 is a graph depicting an example of the IV curves for the SET (plot S) and RESET (plot R) for unipolar transitions for the devices such as depicted in FIGS. 5 and 6. The device may be considered in an OFF state when the bottom electrode voltage is below the SET voltage, e.g., between approximately 3V and 3.5V. In this state, IV curve for the device follows the plot labeled R in FIG. 7. When the electrode voltage is increased to or above the SET voltage, the device is SET so that the IV curve for the device follows the plot labeled S in FIG. 7. Once SET, the device will operate based on IV curve S of FIG. 7 so long as the bottom electrode voltage is between 0V and a RESET voltage, e.g., approximately 2V. When SET and the voltage is increased to or above the RESET voltage, the device is RESET and operates according to the plot labeled R.

Figure 8A:
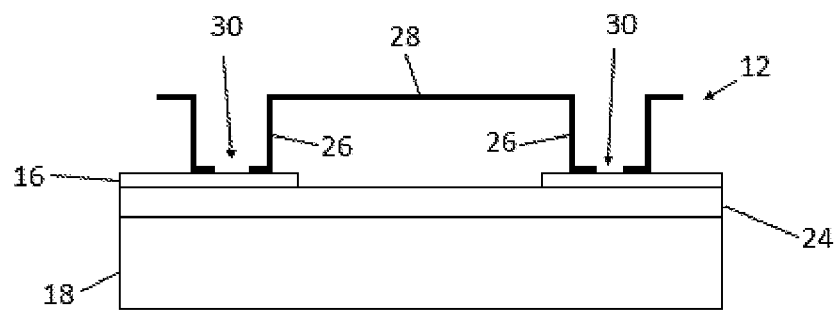
FIG. 8a depicts a previously known bolometer after an ALD alumina layer has been deposited and the anchor structures of the alumina have been patterned.
Figure 8B:
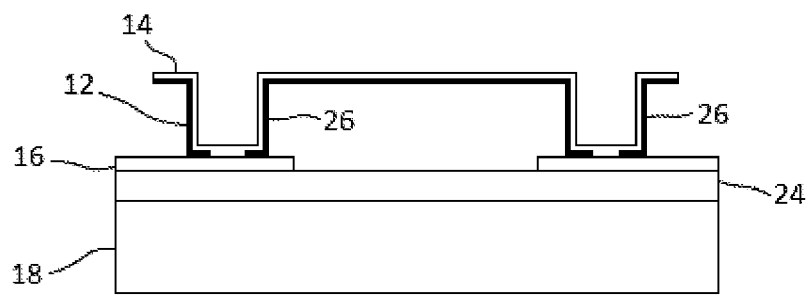
FIG. 8b depicts the bolometer of FIG. 8a after ALD platinum has been deposited on the alumina in electrical contact with the conductive layer on the substrate via the patterned anchor structures of the alumina.

FIGS. 8a and 8b depict a bolometer at different stages during a previously known fabrication process. As depicted in FIG. 8a, a conductive layer 16, such as platinum, is formed using an ALD process on top of a silicon substrate 18, or on top of a passivation layer 24, e.g., silicon oxide, on the substrate 18. The conductive layer 16 is patterned to form the conductive pathways for the readout circuitry. A metal oxide layer 12, e.g., alumina, is formed on top of the conductive layer. The metal oxide layer is deposited using ALD and includes anchor portions 26 and a suspended portion 28. The anchor portions 26 are electrically connected to the conductive layer 16 and extend upwardly to suspend the suspension portion 28 over the substrate 18. The anchor portions 26 and suspension portion 28 of the metal oxide layer 12 are defined by one or more sacrificial layers (not shown) which are deposited on top of the conductive layer 16 and which are patterned to define the structural shape for the metal oxide 12.

The bases of the anchor portions 26 of the metal oxide are typically patterned to provide openings 30 through which the transducer 14 of the bolometer can make contact with the underlying conductive layer 16. As depicted in FIG. 8b, the absorber/transducer material 14, e.g., platinum, for the bolometer is deposited onto the metal oxide layer 12 using an ALD process. The absorber/transducer 14 is deposited so that it makes contact with the underlying conductive layer 16 via the openings 30 in the base portions of the anchors 26.

Figure 9A:
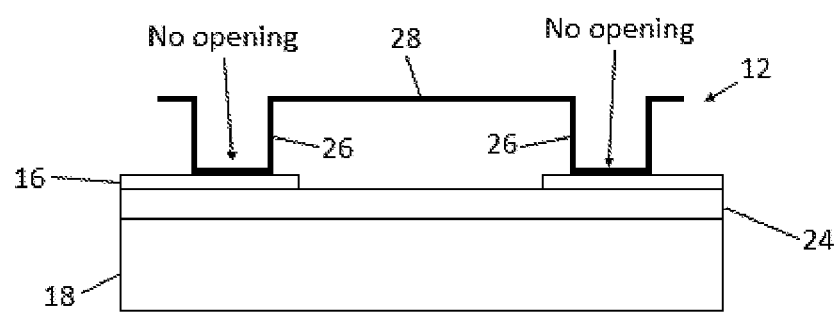
FIG. 9a depicts a bolometer in accordance with the present disclosure after ALD alumina has been deposited on the substrate and the patterning step has been omitted.
Figure 9B:
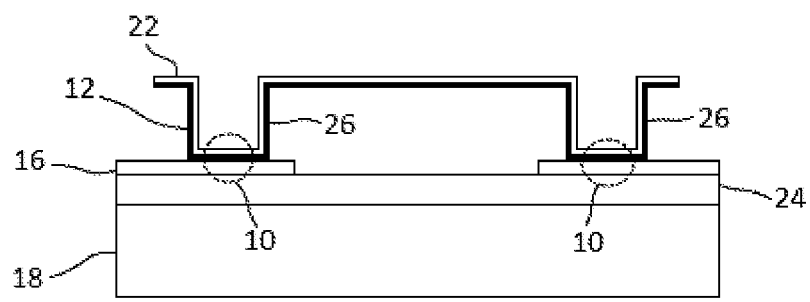
FIG. 9b depicts the bolometer of FIG. 9a after ALD platinum has been deposited on the alumina to form anchors having MIM configurations.

Referring to FIGS. 9a and 9b, to enable resistive switching in bolometers utilizing metal oxide, such as alumina, the patterning of the metal oxide layer to provide openings (FIG. 8a) for electrical contact between the transducer and the underlying conductive layer can be omitted. As a result, when the absorber/transducer material is deposited onto the metal oxide, MIM stacks 10 are formed at the base of each anchor structure 26 of the bolometer which can serve as resistive switching elements. In this case, the top metal layer 22 is formed of a Noble metal, such as platinum. As a result, unipolar resistive switching can be utilized to SET (i.e., turn ON) the bolometer to take measurements and then RESET (i.e., turn OFF) the bolometer when not taking measurements.

Figure 10A:
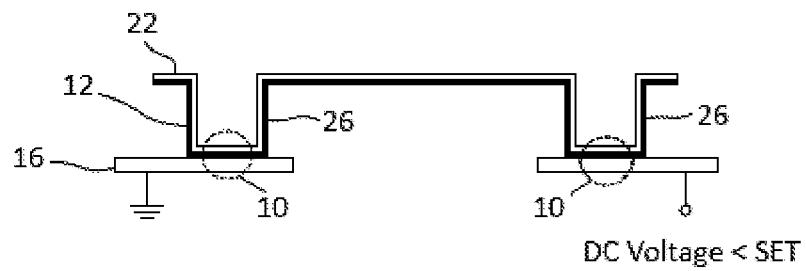
FIG. 10a depicts a bolometer, such as depicted in FIG. 9b, connected to circuitry for providing a DC voltage to the bolometer with the DC voltage less than a SET voltage so that the bolometer is in an OFF state.
Figure 10B:
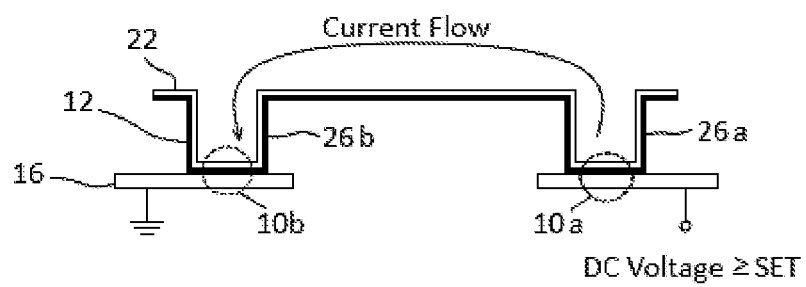
FIG. 10b depicts the bolometer of FIG. 10a when the DC voltage is greater than or equal to the SET voltage and resistive switching has occurred so that a current pathway is formed through the bolometer.

FIGS. 10a and 10b schematically depict the bolometer of FIG. 9b with one side of the bolometer connected to a DC voltage source (via the conductive layer 16) and the other side of the bolometer connected to ground. In FIG. 10a, the bolometer is in a switched off condition resulting from the DC voltage being less than the SET voltage. This is graphically depicted by the IV curve labeled R in FIG. 10c. When the DC voltage is equal to or surpasses the SET voltage, the bolometer is turned on. The SET voltage causes two consecutive resistive switching events to occur in the MIM stacks 10a, 10b. The first resistive switching event occurs in the first MIM stack 10a in the first anchor structure 26a when the DC voltage reaches the SET voltage. When the first MIM stack 10a is SET, the bolometer conducts the voltage to the second MIM stack 10b resulting in the second resistive switching event as the second MIM stack 10b is SET.

Figure 10C:
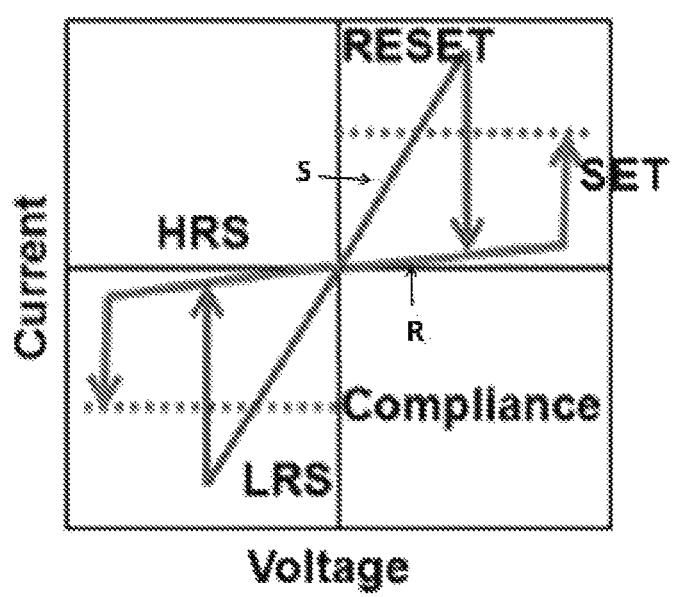
FIG. 10c is a graph of the IV curves for the device of FIGS. 10a and 10b.

When both MIM stacks 10a, 10b are SET, a current path is opened through the bolometer and the device is turned on and the device operates in accordance with the IV curve labeled S in FIG. 10c. The dotted line indicates a maximum current limit for the current passing through the bolometer to prevent damage to the device. The maximum current limit may be set in any suitable manner, such as by an external resistor(s) or resistive circuit connected to the bolometer. Once SET, the DC voltage can be turned back to 0V. The ALD bolometer with a SET metal oxide, or alumina, will act Ohmic and can be used for regular non-contact temperature measurements, e.g., using DC or pulsing mechanisms. The bolometer will remain SET while the DC voltage is between 0V and the RESET voltage. When SET and the DC voltage reaches the RESET voltage, the bolometer will transition to the high resistive state and operate according to the IV curve R in FIG. 10c.

Figure 11:
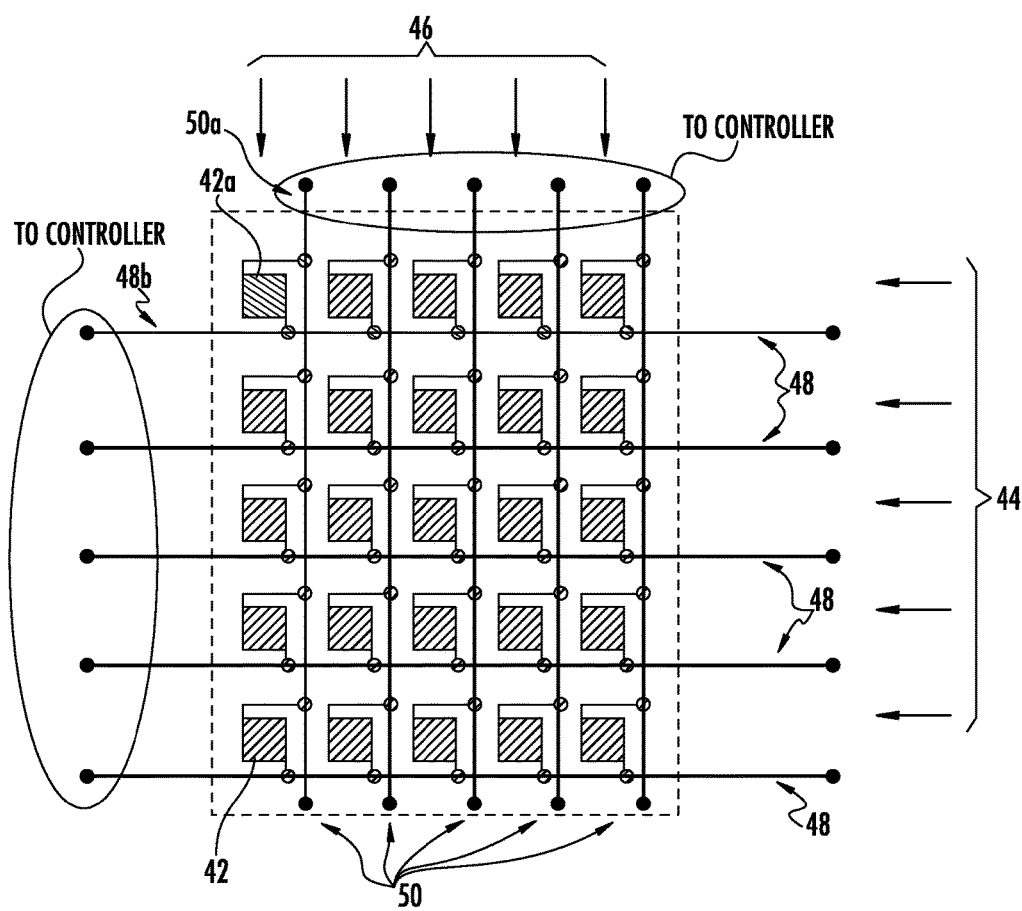
FIG. 11 is a schematic depiction of a focal-plane-array of bolometers capable of being resistively switched.

FIG. 11 is a schematic depiction of a focal-plane-array of bolometers configured for unipolar resistive switching. The array 40 of FIG. 11 includes a plurality of bolometers 42 arranged in a predetermined number of rows 44 and a predetermined number of columns 46. In FIG. 11, the array 40 comprises a 5×5 array of bolometers 42 although any suitable number and arrangement of bolometer may be used in the array. Each of the bolometers 42 includes resistive switching elements 10 (not shown in FIG. 11), such as depicted in FIGS. 10a and 10b. The bolometers in each row 44 are electrically connected a separate conductor 48, referred to herein as a word line, and the bolometers in each column 46 are electrically connected by a separate conductor 50, referred to herein as a bit line. The word lines 48 and bit lines 50 are each connected to a controller, such as an ASIC. The controller is configured to selectively apply SET and RESET voltages to the word lines 48 and bit lines 50 to switch the bolometers 41 on and off in different patterns and sequences.

Each of the bolometers can be SET (i.e., turned ON) by applying a SET voltage to the word line 48 and the bit line 50 that are connected to that bolometer. The bolometers can be RESET (i.e., turned OFF) by applying a RESET voltage to the word line 48 and the bit line 50 that are connected to that bolometer. For example, to SET the bolometer 42a, the controller applies a SET voltage to word line 48a and bit line 50a. To RESET (i.e., turn OFF) the bolometer 42a, the controller applies a RESET voltage to word line 48a and bit line 50a. The bolometers 42 can be turned ON and OFF as needed. The bolometers 42 may also be activated and deactivated individually or in groups in different sequences and patterns when taking measurements. By setting and resetting the bolometers in different patterns and groups, infrared detail capture similar to an image sensor in a digital camera is possible except the image captured would be IR image with temperature profile, e.g. a thermal map. Such a system could also be used in night vision devices. Because a resistive switching element built into the bolometers is used to activate and deactivate the bolometers on the word lines and bit lines, a separate switching mechanism or chip for switching the bolometers is not required. This decreases the complexity as well as the cost of implementing a bolometer focal-plane-array.

A number of other advantages are enabled by incorporating resistive switching into MEMS devices, such as bolometers. For example, implementing resistive switching enables the step of patterning the ALD metal oxide for electrical contact with the underlying conductive layer to be omitted which reduces the processing steps required for the device. This leads to a simpler process flow that could be realized in a shorter duration.

The possibility of turning the ALD Bolometers selectively ON/OFF enables various patterns of scanning the incoming Infrared radiation to be realized. This could be utilized for better averaging the Temperature data over the scanned area. Having selectively ON and OFF bolometer pixels also simplifies the construction which can facilitate the incorporation of other structures, such as 'dark pixels' (not sensitive to incoming Infrared) and Wheatstone Bridges, which are difficult to implement in previously known devices.

The performance of resistively switched bolometers can be advantageously customized by providing different thicknesses of ALD metal oxide, or alumina, for different Bolometer pixels to tune the SET/RESET voltages specific to a single or a set of bolometer pixels. The SET/RESET voltages may also be tuned through the selection of the type of metal oxide material used and/or through the use of multiple metal oxide layers of differing materials.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A microelectromechanical systems (MEMS) device, comprising:
    a silicon wafer having an upper surface, the upper surface defining a sensing region;
    a patterned conductive layer on the upper surface;
    a bolometer including a suspension portion that extends over the sensing region, the suspension portion being suspended above the sensing region by at least one anchor structure which extends upwardly from the patterned conductive layer to space the suspension portion a predetermined distance apart from the upper surface of the silicon wafer, the suspension portion and the at least one anchor structure being formed by a layer stack comprising a bottom insulator layer and a top conductive layer; and
    a control circuit electrically connected to the patterned conductive layer and being configured to selectively apply a first DC voltage and a second DC voltage to the patterned conductive layer,
    wherein the at least one anchor structure includes a base portion that is attached to the patterned conductive layer,
    wherein, in the base portion of the at least one anchor structure, the bottom insulator layer is arranged adjacent the patterned conductive layer and is interposed between the top conductive layer and the patterned conductive layer such that there is no direct contact between the top conductive layer and the patterned conductive layer wherein the base portion of the at least one anchor structure is configured as a resistive switch such that, when the first DC voltage is applied to the patterned conductive layer, the base portion transitions from a high resistive state to a low resistive state, and, when the second DC voltage is applied to the patterned conductive layer, the base portion transitions from a high resistive state to a low resistive state, wherein, when in the high resistive state, the base portion has a resistance that substantially prevents current flow between the top conductive layer and the patterned conductive layer, and wherein, when in the low resistive state, the base portion of the at least one anchor structure forms an ohmic contact between the top conductive layer and the patterned conductive layer such that enables current to flow between the top conductive layer and the patterned conductive layer.

2. The MEMS device of claim 1, wherein the bottom insulator layer is formed of alumina.

3. The MEMS device of claim 2, wherein at least one of the top conductive layer and the patterned conductive layer comprises platinum.

4. The MEMS device of claim 1, wherein the first DC voltage corresponds to a SET voltage for the resistive switch and the second DC voltage corresponds to a RESET voltage for the resistive switch.

5. The MEMS device of claim 1, wherein the bottom insulator layer has a thickness of approximately 10 nm.

6. The MEMS device of claim 5, wherein the top conductive layer has a thickness of approximately 50 nm.

7. The MEMS device of claim 1, wherein the at least one anchor structure comprises a first and second anchor structure, the first anchor structure including a first base portion that acts as a first resistive switching element and the second anchor structure including a second base portion that acts as a second resistive switching element.

8. A method of operating a MEMS device, the method comprising:
applying a first DC voltage to a base portion of at least one anchor structure of a bolometer, the bolometer including a suspension portion that extends over a sensing region on a silicon wafer, the at least one anchor structure extending upwardly from a patterned conductive layer on the silicon wafer to space the suspension portion a predetermined distance apart from an upper surface of the silicon wafer, at least the base portion of the at least one anchor structure being formed by a layer stack comprising a bottom insulator layer and a top conductive layer, the bottom insulator layer being arranged adjacent the patterned conductive layer and being interposed between the top conductive layer and the patterned conductive layer such that there is no direct contact between the top conductive layer and the patterned conductive layer, wherein the base portion of the at least one anchor structure is configured as a resistive switch such that, when the first DC voltage is applied, the base portion transitions from a high resistive state to a low resistive state, wherein, when in the high resistive state, the base portion has a resistance that substantially prevents current flow between the top conductive layer and the patterned conductive layer, and wherein, when in the low resistive state, the base portion of the at least one anchor structure forms an ohmic contact between the top conductive layer and the patterned conductive layer such that enables current to flow between the top conductive layer and the patterned conductive layer.

9. The method of claim 8, further comprising:
applying a second DC voltage to the base portion of the at least one anchor structure, the application of the second DC voltage causing the base portion to transition from a low resistive state to a high resistive state.

10. The method of claim 9, wherein the bottom insulator layer is formed of alumina.

11. The method of claim 10, wherein at least one of the top conductive layer and the patterned conductive layer comprises platinum.

12. The method of claim 9, wherein the first DC voltage corresponds to a SET voltage for the resistive switch and the second DC voltage corresponds to a RESET voltage for the resistive switch.

13. The method of claim 9, wherein the at least one anchor structure comprises a first and second anchor structure, the first anchor structure including a first base portion that acts as a first resistive switching element and the second anchor structure including a second base portion that acts as a second resistive switching element.

14. A focal-plane-array of bolometers comprising:
an array of bolometers having a predetermined number of rows and a predetermined number of columns, each of the bolometers including:
a suspension portion that extends over a sensing region on a silicon wafer and at least one anchor structure extending upwardly from a patterned conductive layer on the silicon wafer to space the suspension portion a predetermined distance apart from an upper surface of the silicon wafer, the at least one anchor structure including a base portion formed by a layer stack comprising a bottom insulator layer and a top conductive layer, the bottom insulator layer being arranged adjacent the patterned conductive layer and being interposed between the top conductive layer and the patterned conductive layer such that there is no direct contact between the top conductive layer and the patterned conductive layer, wherein the base portion of the at least one anchor structure is configured as a resistive switch such that, when a SET voltage is applied, the base portion transitions from a high resistive state to a low resistive state, and when a RESET voltage is applied, the base portion transitions from the low resistive state to a high resistive state, wherein, when in the high resistive state, the base portion has a resistance that substantially prevents current flow between the top conductive layer and the patterned conductive layer, wherein, when in the low resistive state, the base portion of the at least one anchor structure forms an ohmic contact between the top conductive layer and the patterned conductive layer such that enables current to flow between the top conductive layer and the patterned conductive layer, and a control circuit electrically connected to array of bolometers by a plurality of word lines and a plurality of bit lines, each of the rows of bolometers being electrically interconnected to each other and to the control circuit by one of the word lines and each of the columns of bolometers being electrically interconnected by one of the bit lines, wherein the control circuit is configured to selectively apply the SET voltage and the RESET voltage to the plurality of word lines and the plurality of bit lines to switch the bolometers in the array on and off in desired patterns.

* * * * *